United States Patent
Loo et al.

(10) Patent No.: US 11,482,664 B2
(45) Date of Patent: Oct. 25, 2022

(54) PLANARIZATION METHOD

(71) Applicant: AAC ACOUSTIC TECHNOLOGIES (SHENZHEN) CO., LTD., Shenzhen (CN)

(72) Inventors: Lieng Loo, Singapore (SG); Kahkeen Lai, Singapore (SG); Yilei Wu, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 28 days.

(21) Appl. No.: 17/136,051

(22) Filed: Dec. 29, 2020

(65) Prior Publication Data

US 2021/0336125 A1  Oct. 28, 2021

(30) Foreign Application Priority Data

Apr. 23, 2020  (CN) .......................... 202010328322.4

(51) Int. Cl.
*H01L 41/332* (2013.01)
*H01L 41/297* (2013.01)
*H01L 41/23* (2013.01)
*H01L 41/25* (2013.01)
*H01L 41/47* (2013.01)

(52) U.S. Cl.
CPC ............ *H01L 41/332* (2013.01); *H01L 41/23* (2013.01); *H01L 41/25* (2013.01); *H01L 41/297* (2013.01); *H01L 41/47* (2013.01)

(58) Field of Classification Search
CPC ....... H01L 41/332; H01L 41/23; H01L 41/25; H01L 41/297; H01L 41/47; H03H 3/02
See application file for complete search history.

(56) References Cited

U.S. PATENT DOCUMENTS

| | | | | |
|---|---|---|---|---|
| 5,581,861 A * | 12/1996 | Lee | ......................... | B41J 2/1623 29/25.35 |
| 6,416,934 B1 * | 7/2002 | Yamagishi | ............... | H03H 3/08 430/311 |
| 8,256,093 B2 * | 9/2012 | Fattinger | ................... | H03H 3/02 156/89.12 |
| 9,197,185 B2 * | 11/2015 | Zou | ......................... | H03H 9/131 |
| 10,554,191 B2 * | 2/2020 | Lim | ......................... | H01L 41/23 |
| 2002/0189062 A1 * | 12/2002 | Lin | ......................... | H03H 3/02 29/25.35 |

(Continued)

FOREIGN PATENT DOCUMENTS

| CN | 101083456 A | * | 12/2007 | ............. H01L 41/08 |
|---|---|---|---|---|
| CN | 105680813 A | * | 6/2016 | |

*Primary Examiner* — Jeffrey T Carley

(74) *Attorney, Agent, or Firm* — W&G Law Group

(57) ABSTRACT

The invention provides a planarization method, which can make the local flatness of the product to be processed more uniform. The product has a cavity filled with oxide and includes a first electrode layer, a piezoelectric layer and a second electrode layer superposed on the cavity. The first electrode layer covers the cavity and includes a first inclined face around the first electrode layer, and the piezoelectric layer covers the first electrode layer and is arranged on the first electrode layer. The planarization method includes: depositing a passivation layer on the second electrode layer and etching the passivation layer completely until the thickness of the passivation layer is reduced to the required thickness.

7 Claims, 6 Drawing Sheets

(56) References Cited

U.S. PATENT DOCUMENTS

| | | | | |
|---|---|---|---|---|
| 2003/0102773 A1* | 6/2003 | Ylilammi | ............... | H03H 9/173 310/311 |
| 2003/0117041 A1* | 6/2003 | Kurihara | ................ | B41J 2/1646 257/E27.006 |
| 2004/0145430 A1* | 7/2004 | Metzger | ................... | H03H 3/02 333/191 |
| 2005/0179508 A1* | 8/2005 | Sato | ......................... | H03H 3/02 333/187 |
| 2011/0084779 A1* | 4/2011 | Zhang | ...................... | H03H 3/02 333/187 |
| 2011/0298564 A1* | 12/2011 | Iwashita | ................ | H03H 9/173 333/187 |
| 2014/0339959 A1* | 11/2014 | Lee | ......................... | H03H 3/02 438/42 |
| 2016/0163954 A1* | 6/2016 | Shin | ....................... | H03H 9/173 29/25.35 |
| 2017/0317660 A1* | 11/2017 | Kim | ........................ | H03H 9/54 |
| 2018/0013397 A1* | 1/2018 | Lim | ....................... | H03H 9/173 |

* cited by examiner depositing a first passivation layer on the second electrode layer for covering the second electrode layer and the piezoelectric layer — S100 etching the first passivation layerto form a lining pad by the first passivation layer on the periphery of the third inclined surface part on the periphery of the second electrode layer, the lining pad is flush with the second electrode layer, and due to the third inclined surface part, a fourth inclined surface part is formed by the lining pad on the surface of the third inclined surface part — S200 depositing a second passivation layer on the second electrode layer and covering the second electrode layer, the lining pad and the piezoelectric layer, and the second passivation layer is provided with a first plane part, a fifth inclined surface part arranged on the periphery of the first plane part, and a second plane part extending from the fifth inclined surface part; the projection of the first plane part in the vertical direction covers the cavity; and the orthographic projection of the fifth inclined surface part in the vertical direction falls outside the cavity — S300 releasing the oxide in the cavity for obtaining a finished product — S500

Fig. 1

```
┌─────────────────────────────────────────────────────────┐
│ depositing a first passivation layer on the second electrode layer │
│ for covering the second electrode layer and the piezoelectric      │─── S100
│ layer                                                              │
└─────────────────────────────────────────────────────────┘
                              │
                              ▼
┌─────────────────────────────────────────────────────────┐
│ etching the first passivation layerto form a lining pad by the     │
│ first passivation layer on the periphery of the third inclined     │─── S200
│ surface part on the periphery of the second electrode layer, the   │
│ lining pad is flush with the second electrode layer, and due to    │
│ the third inclined surface part, a fourth inclined surface part is │
│ formed by the lining pad on the surface of the third inclined      │
│ surface part                                                       │
└─────────────────────────────────────────────────────────┘
                              │
                              ▼
┌─────────────────────────────────────────────────────────┐
│ depositing a second passivation layer on the second electrode      │
│ layer and covering the second electrode layer, the lining pad and  │
│ the piezoelectric layer, and the second passivation layer is       │─── S300
│ provided with a first plane part, a fifth inclined surface part    │
│ arranged on the periphery of the first plane part, and a second    │
│ plane part extending from the fifth inclined surface part; the     │
│ projection of the first plane part in the vertical direction covers│
│ the cavity; and the orthographic projection of the fifth inclined  │
│ surface part in the vertical direction falls outside the cavity    │
└─────────────────────────────────────────────────────────┘
                              │
                              ▼
┌─────────────────────────────────────────────────────────┐
│ etching on the second passivation layer until the thickness of the │
│ second passivation layer is reduced to the required thickness;     │─── S400
│ and                                                                │
└─────────────────────────────────────────────────────────┘
                              │
                              ▼
                                                          ─── S500
┌─────────────────────────────────────────────────────────┐
│ releasing the oxide in the cavity for obtaining a finished product │
└─────────────────────────────────────────────────────────┘
```

Fig. 4

PLANARIZATION METHOD

FIELD OF THE PRESENT DISCLOSURE

The invention relates to the technical field of planarization processing methods, in particular to a planarization method.

DESCRIPTION OF RELATED ART

In the prior art, a product requiring planarization processing is usually implemented through a CMP (chemical mechanical polishing) process, and the CMP process has the following problems:

1. The CMP process is relatively complicated and relatively high in cost.
2. The CMP process has requirements for materials, and multiple materials are not suitable for the CMP process, for example, aluminum nitride is not a common material for the CMP process, and silicon nitride is difficult to process for the CMP process.
3. The conventional CMP process is to planarize the whole to-be-processed product in the planarization process.

Therefore, it is necessary to provide a novel planarization method for solving the problems.

SUMMARY OF THE PRESENT INVENTION

One of the major objects of the present invention is to provide a planarization method that is capable of simple operation, high practicability and easy controlling in the implementation process.

Accordingly, the present invention provides a planarization method for partially planarizing a surface of a to-be-processed product having a cavity filled with an oxide, a first electrode layer covering the cavity and having a first inclined surface part positioned on a periphery of the first electrode layer, a piezoelectric layer covering the first electrode layer and having a second inclined surface part according to the first inclined surface part, and a second electrode layer covering a part of the piezoelectric layer and having a third inclined surface part positioned on a periphery of the second electrode layer; and the orthographic projection of the second electrode layer in the vertical direction falls inside the cavity; and wherein the planarization method comprises steps of:

depositing a first passivation layer on the second electrode layer for covering the second electrode layer and the piezoelectric layer; the first passivation layer is etched to form a lining pad by the first passivation layer on the periphery of the third inclined surface part on the periphery of the second electrode layer, the lining pad is flush with the second electrode layer, and due to the third inclined surface part, a fourth inclined surface part is formed by the lining pad on the surface of the third inclined surface part;

a second passivation layer is deposited on the second electrode layer and covers the second electrode layer, the lining pad and the piezoelectric layer, and the second passivation layer is provided with a first plane part, a fifth inclined surface part arranged on the periphery of the first plane part, and a second plane part extending from the fifth inclined surface part; the projection of the first plane part in the vertical direction covers the cavity; and the orthographic projection of the fifth inclined surface part in the vertical direction falls outside the cavity.

In addition, the fifth inclined surface part is formed on the second passivation layer due to the presence of the fourth inclined surface part, and a sixth inclined surface part arranged on the periphery of the second plane part is also formed on the second passivation layer due to the presence of the second inclined surface part.

In addition, after the second passivation layer is deposited on the second electrode layer, the method further comprises the following process:

carrying out the totally etching on the second passivation layer until the thickness of the second passivation layer is reduced to the required thickness; and releasing the oxide in the cavity for obtaining a finished product.

In addition, after the second passivation layer is deposited on the second electrode layer, the method further comprises the following process:

releasing the oxide in the cavity for obtaining a finished product.

In addition, the implementation way of total etching for the second passivation layer is total dry etching or total wet etching.

In addition, an aluminum nitride material is adopted by the first passivation layer and the second passivation layer.

In addition, the to-be-processed product is a filter.

BRIEF DESCRIPTION OF THE DRAWINGS

Many aspects of the exemplary embodiment can be better understood with reference to the following drawings. The components in the drawing are not necessarily drawn to scale, the emphasis instead being placed upon clearly illustrating the principles of the present disclosure.

FIG. 1 is a flowchart of a planarization method in an embodiment of the invention.

FIG. 4 is a flowchart of the planarization method in another embodiment of the invention.

DETAILED DESCRIPTION OF THE EXEMPLARY EMBODIMENTS

Figure 2:
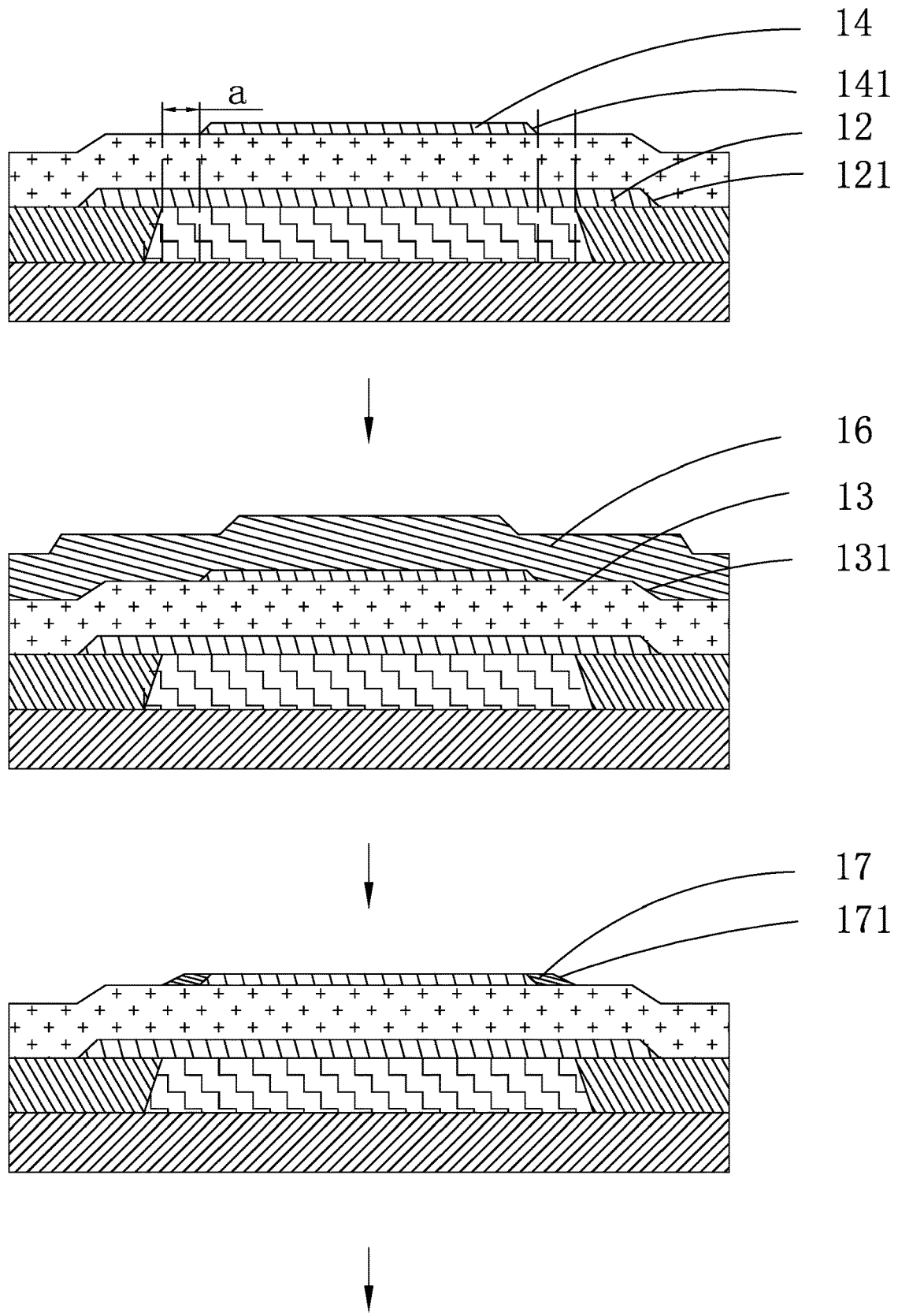
FIG. 2 and FIG. 3 are process diagrams of the planarization method in the embodiment of the invention.

The present disclosure will hereinafter be described in detail with reference to several exemplary embodiments. To make the technical problems to be solved, technical solutions and beneficial effects of the present disclosure more apparent, the present disclosure is described in further detail together with the figure and the embodiments. It should be understood that the specific embodiments described hereby is only to explain the disclosure, not intended to limit the disclosure.

It should be noted that, all directional instructions in the embodiment of the invention (such as upper, lower, left, right, front, rear, inside, outside, top and bottom) are used only for explaining relative positional relationships between various components in a particular attitude (as shown in the drawings), and the like. If the particular attitude is changed, the directional instructions are changed accordingly.

It should be further noted that, when an element is referred to as being "fixed" or "arranged" on another element, it may be directly on the other element or intervening elements may be present at the same time. When an element is referred to as being "connected" on another element, it may be directly connected to the other element or intervening elements may be present at the same time.

EMBODIMENTS

As shown in FIGS. 1 to 6, the embodiment of the invention provides a planarization method, which is used for planarizing a to-be-processed product 100, such as a filter. The to-be-processed product 100 is provided with a cavity 11 filled with an oxide 15. The to-be-processed product 100 comprises a first electrode layer 12, a piezoelectric layer 13 and a second electrode layer 14 which are stacked on the cavity 11; the first electrode layer 12 covers the cavity 11 and comprises a first inclined surface part 121 positioned on the periphery of the first electrode layer 12; the piezoelectric layer 13 covers the first electrode layer 12, and due to the first inclined surface part 121, a second inclined surface part 131 is formed by the piezoelectric layer 13 on the surface of the first inclined surface part; the second electrode layer 14 covers part of the piezoelectric layer 13 and comprises a third inclined surface part 141 positioned on the periphery of the second electrode layer 14; and the orthographic projection of the second electrode layer 14 in the vertical direction falls inside the cavity 11. The planarization method comprises the steps:

S100, a first passivation layer 16 is deposited on the second electrode layer 14, an aluminum nitride material can be adopted by the first passivation layer 16, a PVD deposition method or CVD deposition method can be adopted as the deposition mode, and which deposition mode will be used depends on the type and applicability of a required thin film. The first passivation layer 16 covers the second electrode layer 14 and the piezoelectric layer 13.

S200, the first passivation layer 16 is etched to form a lining pad 17 by the first passivation layer 16 on the periphery of the third inclined surface part 141 on the periphery of the second electrode layer 14, the lining pad 17 is flush with the second electrode layer 14, and due to the third inclined surface part 141, a fourth inclined surface part 171 is formed by the lining pad 17 on the surface of the third inclined surface part. The design of the lining pad 17 is to prepare for subsequent deposition of a second passivation layer 18, normally speaking, a spacing (as shown in FIG. 2 *a*) exists between the cavity 11 of the to-be-processed product 100 and the second electrode layer 14, the size of the spacing is a horizontal distance between the top edge of the cavity 11 and the outer edge of the third inclined surface part 141, and an additional spacer is formed at the spacing position, so that the spacing has a greater process margin, and the width of the spacer expands the actual width of the second electrode layer 14; and the processing requirements can be met by depositing the thinner second passivation layer 18 during subsequent deposition of the second passivation layer 18, for example, the orthographic projection of a fifth inclined surface part 182 in the vertical direction can fall outside the cavity 11 by depositing the thinner second passivation layer 18.

S300, the second passivation layer 18 is deposited on the second electrode layer 14, the PVD deposition method or CVD deposition method can be adopted as the deposition mode, and which deposition mode will be used depends on the type and applicability of the required thin film. The second passivation layer 18 covers the second electrode layer 14 and the piezoelectric layer 13; the second passivation layer 18 is provided with a first plane part 181, the fifth inclined surface part 182 arranged on the periphery of the first plane part 181, a second plane part 183 extending from the fifth inclined surface part 182, and a sixth inclined surface part 184 arranged on the periphery of the second plane part 183; the projection of the first plane part 181 in the vertical direction covers the cavity 11; due to the presence of the fourth inclined surface part 171, the fifth inclined surface part 182 is formed on the second passivation layer 18 and the orthographic projection of the fifth inclined surface part 182 in the vertical direction falls outside the cavity 11; and furthermore, due to the presence of the second inclined surface part 131, the sixth inclined surface part 184 is formed on the second passivation layer 18. In this process, the second passivation layer 18 needs to have an enough thickness to enable the orthographic projection of the fifth inclined surface part 182 in the vertical direction to fall outside the cavity 11, for example, the final thickness of the typical second passivation layer 18 is usually in the range of 100-300 nm, if the process of depositing the first passivation layer 16 to form the lining pad 17 is not carried out, the initial deposition thickness of the second passivation layer 18 may be in the range of 300-1,000 nm, while the process of depositing the first passivation layer 16 to form the lining pad 17 is carried out in advance, the orthographic projection of the fifth inclined surface part 182 in the vertical direction can fall outside the cavity 11 as long as the initial deposition thickness of the second passivation layer 18 may be in the range of 100-500 nm, the initial deposition thickness of the second passivation layer 18 is greatly reduced or even the thickness of the deposited second passivation layer 18 is just the required thickness. Therefore, the target of planarizing the surface part (the first plane part 181) of the to-be-processed product 100 can be achieved without the subsequent etching process on the second passivation layer 18. Furthermore, if the filter has the design requirement of improving the acoustic performance, more room is left for processing in sizes of the second electrode layer 14 and the cavity 11. It will be understood that the specific thickness of the second passivation layer 18 depends on the thickness (namely, the overall thickness of the first electrode layer 12, the piezoelectric layer 13 and the second electrode layer 14 in the embodiment) of a stack while the thickness of the stack is determined according to actual requirements.

Figure 3:
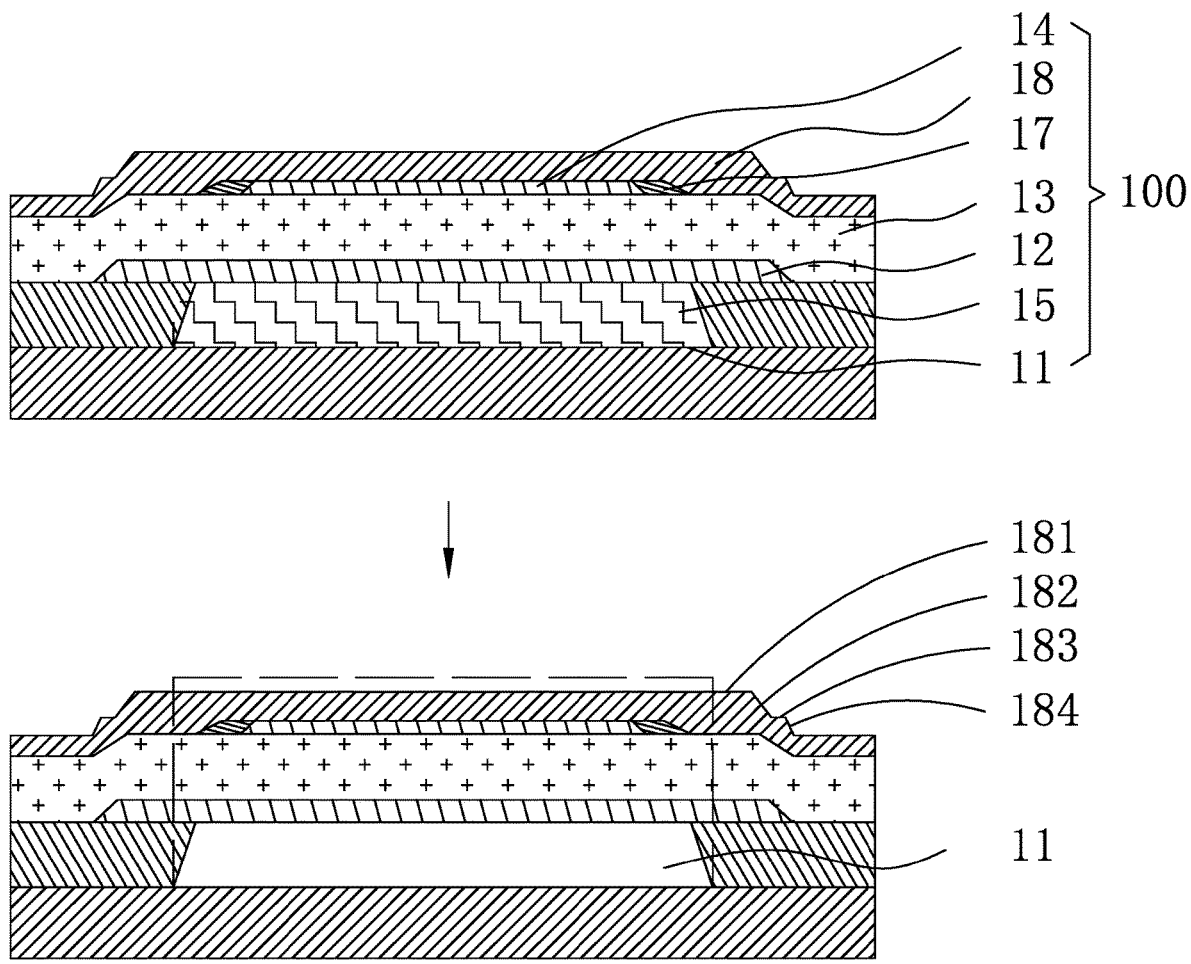
Figure 5:
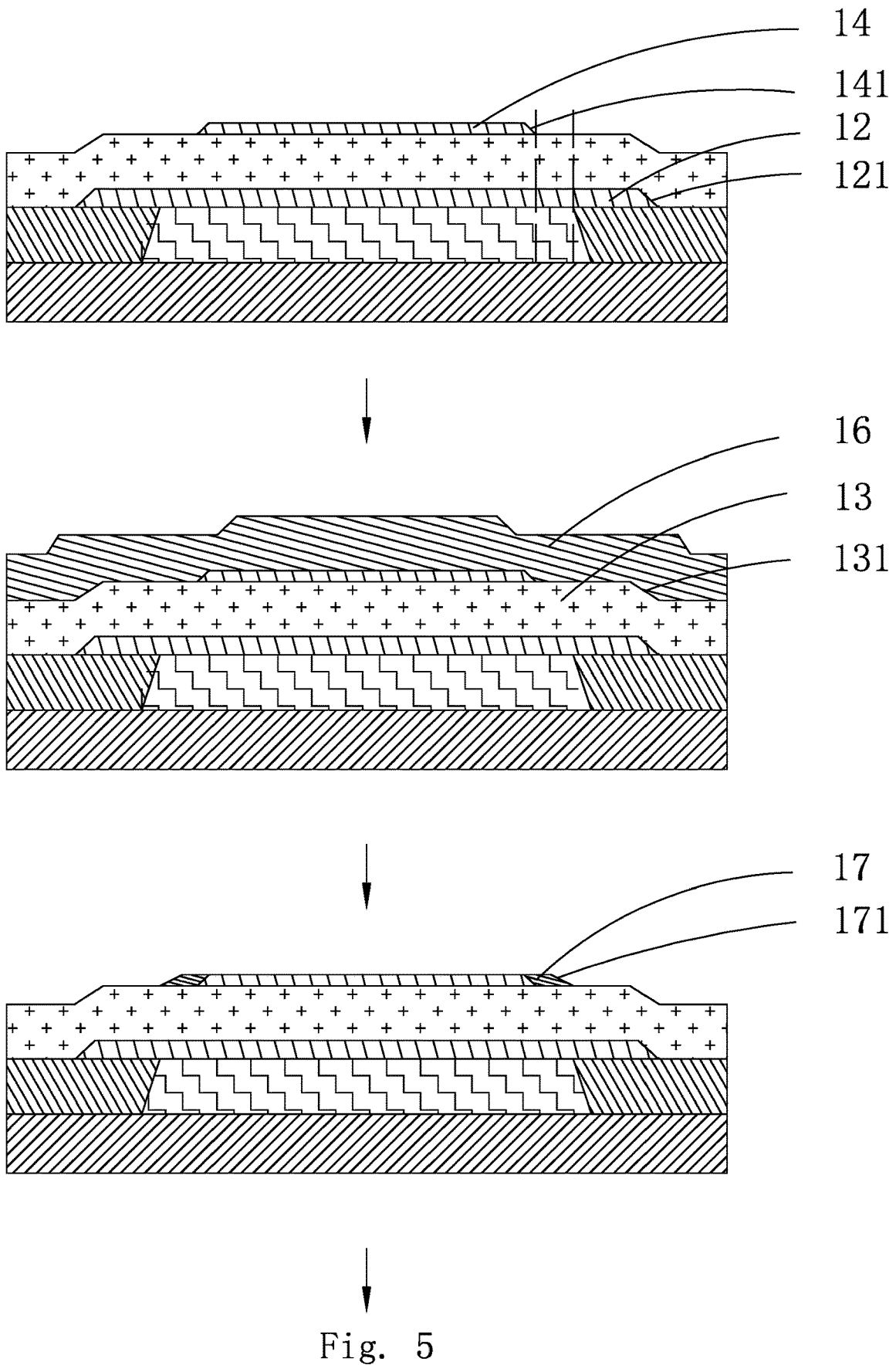
FIGS. 5 and 6 are the process diagrams of the planarization method in the other embodiment of the invention.
Figure 6:
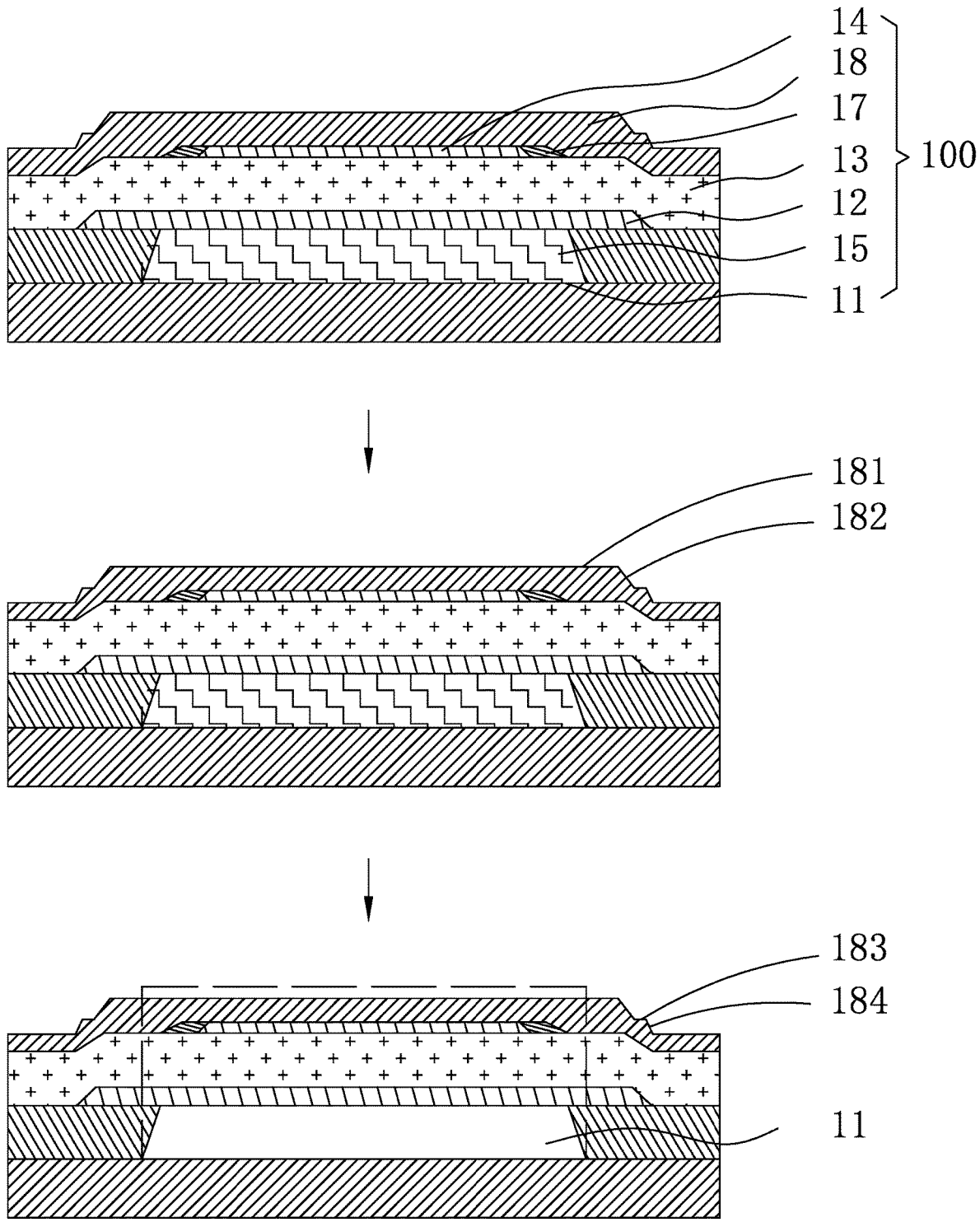

It will be understood that the step S400 is unnecessary, the step S400 (as shown in FIGS. 4 to 6) is required only when the thickness of the deposited second passivation layer 18 exceeds the required thickness, and the step S400 (as shown in FIGS. 1 to 3) is not required if the thickness of the deposited second passivation layer 18 is just the required thickness.

S400, total etching is carried out on the second passivation layer 18 until the thickness of the second passivation layer 18 is reduced to the required thickness, for example, if the required thickness of the typical second passivation layer 18 is in the range of 100-300 nm, the thickness of the second passivation layer 18 needs to be reduced to the range of 100-300 nm. It will be understood that the final required thickness of the second passivation layer 18 depends on the thickness (namely, the overall thickness of the first electrode layer 12, the piezoelectric layer 13 and the second electrode layer 14 in the embodiment) of the stack while the thickness of the stack is determined according to the actual requirements. The implementation way of total etching for the second passivation layer 18 is total dry etching or total wet etching, the total etching described herein refers to etching the second passivation layer 18 from top to bottom at the same etching rate, that is to say, the shape of the second passivation layer 18 is not changed before and after the etching, and only the thickness is changed. Therefore, compared with a CMP process, the planarization method is smaller in planarized area and can achieve better uniformity control in the planarization process.

Furthermore, in the total etching method, an etching material is not excessively limited, for example, the aluminum nitride material or silicon nitride material is not suitable for the CMP process while the aluminum nitride material or silicon nitride material is not limited for the total etching method, therefore, the aluminum nitride material can be adopted by the second passivation layer 18.

S500, the oxide 15 in the cavity 11 is released to obtain a finished product.

The planarization method provided by the embodiment is simple in operation, high in practicability and easier to control in the implementation process, and can achieve better local planarization. Furthermore, the planarization method is not limited to the material of the to-be-processed product 100 and is wide in application range.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A planarization method, comprising:
   S000: providing a product, comprising: a cavity filled with an oxide; a first electrode layer covering the cavity and having a first inclined surface part positioned on a periphery thereof; a piezoelectric layer covering the first electrode layer and having a second inclined surface part overlapping the first inclined surface part; and a second electrode layer covering part of the piezoelectric layer and having a third inclined surface part positioned on a periphery thereof wherein an orthographic projection of the second electrode layer in the vertical direction falls inside the cavity;
   S100: depositing a first passivation layer on the second electrode layer, covering the second electrode layer and the piezoelectric layer;
   S200: etching the first passivation layer to form a lining pad having a fourth inclined surface part on a periphery of the third inclined surface part and aligned with the second electrode layer;
   S300: depositing a second passivation layer, covering the second electrode layer, the lining pad and the piezoelectric layer, and having a first plane part, a fifth inclined surface part surrounding the first plane part and a second plane part extending from the fifth inclined surface part; wherein an orthographic projection of the first plane part in the vertical direction covers the cavity; an orthographic projection of the fifth inclined surface part in the vertical direction falls outside the cavity.

2. The planarization method according to claim 1, wherein the fifth inclined surface part is inclined corresponding to the fourth inclined surface part, and a sixth inclined surface part arranged on the periphery of the second plane part is formed on the second passivation layer and inclined corresponding to the second inclined surface part.

3. The planarization method according to claim 1, further comprising the following process after the S300:
   S400: etching entire surface of the second passivation layer; and
   S500: releasing the oxide in the cavity.

4. The planarization method according to claim 1, further comprising the following process after the S300:
   S500: releasing the oxide in the cavity.

5. The planarization method according to claim 1, wherein the etching of the second passivation layer is dry etching or wet etching.

6. The planarization method according to claim 1, wherein the first passivation layer and the second passivation layer are formed of an aluminum nitride material.

7. The planarization method according to claim 1, wherein the product is a filter.

\* \* \* \* \*